(12) United States Patent
Ekawa et al.

(10) Patent No.: US 6,376,338 B2
(45) Date of Patent: *Apr. 23, 2002

(54) MANUFACTURING METHOD OF A SEMICONDUCTOR DEVICE HAVING A DIFFRACTION GRATING

(75) Inventors: Mitsuru Ekawa; Takuya Fujii; Yuji Kotaki; Manabu Matsuda, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,262

(22) Filed: Jan. 8, 1999

(30) Foreign Application Priority Data

May 13, 1998 (JP) ............................................ 10-130771

(51) Int. Cl.[7] .............................................. H01L 21/20
(52) U.S. Cl. ....................... 438/478; 438/478; 438/479; 438/483
(58) Field of Search ................................ 438/767, 779, 438/700, 718, 719, 478, 479, 483

(56) References Cited

U.S. PATENT DOCUMENTS

| 4,805,184 A | * | 2/1989 | Fiddyment et al. ............ 372/96 |
| 5,023,198 A | * | 6/1991 | Strege .......................... 437/129 |
| 5,077,752 A | * | 12/1991 | Tada et al. ..................... 372/96 |
| 5,172,402 A | * | 12/1992 | Ogita et al. .................... 372/20 |
| 5,253,264 A | * | 10/1993 | Suzuki et al. .................. 372/46 |
| 5,327,450 A | * | 7/1994 | Fujii ........................... 372/96 |
| 5,533,041 A | * | 7/1996 | Matsuda et al. ............... 372/50 |
| 5,937,273 A | * | 8/1999 | Fujii ............................ 438/46 |
| 6,034,983 A | * | 3/2000 | Fujii et al. ..................... 372/50 |
| 6,088,377 A | * | 7/2000 | Matsuda ....................... 372/50 |

FOREIGN PATENT DOCUMENTS

| JP | 61-179525 | * | 8/1986 |
| JP | 63-213383 | * | 9/1988 |
| JP | 4-216693 | * | 8/1992 |

* cited by examiner

Primary Examiner—Benjamin L. Utech
Assistant Examiner—Charlotte A. Brown
(74) Attorney, Agent, or Firm—Armstrong, Westerman & Hattori, LLP

(57) ABSTRACT

A first layer of InP is deposited on a diffraction grating so as to cover it, by MOCVD in which $PH_3$ or organophosphorus is used as a source material of P and in which $H_2$ is used as a carrier gas. The substrate is heated up to a temperature which is higher than the substrate temperature during the first layer deposition, and then a second layer is deposited on the first layer. An active layer is deposited on the second layer. Found out is such a growth rate of an InP layer as to cause the photoluminescence intensity of a layer corresponding to the active layer to be one tenth as small as that when the InP layer is deposited at a growth rate of 0.2 microns per hour in the case where the InP layer deposition is carried out instead of the first layer deposition under the conditions wherein the ratio of the flow rate of the source material of P to the total flow rate of the carrier gas and the substrate temperature are the same as those in the first layer deposition but the growth rate of the InP layer is different from that of the first layer. The growth rate of the first layer is lower than such a growth rate of the InP layer as to cause the photoluminescence intensity to be one tenth. Accordingly, a diffraction grating can be formed with excellent reproductiveness and high accuracy, moreover, a high quality semiconductor layer can be deposited on thus formed diffraction grating.

20 Claims, 7 Drawing Sheets

PHOTOLUMINESCENCE INTENSITY

MANUFACTURING METHOD OF A SEMICONDUCTOR DEVICE HAVING A DIFFRACTION GRATING

This application is based on Japanese patent application No. Hei 10-130771 filed on May 13, 1998, the whole contents of which are incorporated by reference.

BACKGROUND OF THE INVENTION

1. Field of the Invention

The present invention relates to a manufacture method of a semiconductor device, more particularly to a manufacture method of a semiconductor device having a diffraction grating.

2. Description of the Related Art

FIG. 6 is a cross-sectional view showing a conventional distributed feedback (DFB) semiconductor laser device. A diffraction grating 110 having a plurality of grooves is formed on a principal surface of an n-type InP substrate 100. A guide layer 101 of n-type InGaAsP is formed on the diffraction grating 110. An active layer 102 of InGaAsP is formed on the guide layer 101. A cladding layer 104 of p-type InP is formed on a guide layer 103. A contact layer 105 of p-type InGaAsP is formed on the cladding layer 104.

An electrode 106 is formed on the contact layer 105. An electrode 107 is formed on a bottom surface of the InP substrate 100.

The active layer 102 and the guide layers 101 and 103 have large refractive indices. Those layers are sandwiched by the InP substrate 100 and the cladding layer 104 which have small refractive indexes to form a waveguide. Only a light having waveform which corresponds to the groove pattern on the diffraction grating 110 is Bragg reflected. The reflections are repeated in the waveguide. As a result, the light is oscillated.

The diffraction grating 110 is formed by the following steps of first forming a resist pattern with the interference exposure, then partially etching the surface region of the InP substrate 100 using the resist pattern as an etching mask.

During the formation of the diffraction grating 110, unevenness of the etching occurs sometimes. In this case, it is difficult to form an even diffraction grating in the substrate. Further, while a substrate is heated for forming the InGaAsP guide layer on the diffraction grating 110, the diffraction grating 110 is occasionally transformed by heat, resulting in the uncontrolled corrugation of the diffraction grating. It is known a method for avoiding such thermal transformation of the diffraction grating 110 by covering the surface of the diffraction grating 110 with GaAs. In this case, however, the crystallinity of the laser structure to be formed on the GaAs layer is easily deteriorated if the condition for covering the GaAs layer is not optimized.

Coupling coefficient, which represents the strength of distributed feedback to the light through the waveguide, depends on the amplitude of the corrugation of a diffraction grating. InP is easily transformed by heat as mentioned above, therefore, it is difficult to control the depth of the grooves on the InP diffraction grating accurately. Moreover, it is also difficult to control the coupling coefficient.

Recently, there is a great demand for a diffraction grating having large coupling coefficient to realize a coolerless DFB laser device. Larger amplitude of the corrugated diffraction grating is necessary for enlarging the coupling coefficient of the diffraction grating. However, if an InGaAsP guide layer is grown on the corrugated diffraction grating of InP having large amplitude, the composition modulation i.e., unevenness of the composition appears. For example, composition of Group III elements on the top of the corrugation differs from that on the bottom of the corrugation. If an active layer is grown on the guide layer having such composition modulation, crystallinity of the active layer is deteriorated.

SUMMARY OF THE INVENTION

It is an object of the present invention to provide a manufacture method of a semiconductor device for forming a diffraction grating with high reproductiveness and accuracy, and depositing a high quality semiconductor layer on the diffraction grating.

According to the first aspect of the present invention, it is provided a manufacture method of a semiconductor device comprising the steps of: depositing a III–V compound semiconductor layer, having a refractive index which differs from a refractive index of InP, on a surface of a substrate; forming a plurality of grooves in said compound semiconductor layer so as to reach said substrate surface, in order to form a diffraction grating; forming a first layer of InP so as to fill said grooves and cover said diffraction grating, by metal organic chemical vapor deposition in which an organic metal is used as a source material of In, one of $PH_3$ and organophosphorus is used as a source material of P, and $H_2$ is used as a carrier gas; forming a second layer of InP on said first layer with the temperature of the substrate being higher than that during the first layer formation; and forming an active layer on said second layer; wherein said first layer is deposited at a growth rate lower than such a growth rate of an InP layer as to cause a photoluminescence intensity of a layer corresponding to said active layer to be one tenth as small as that when the InP layer is deposited at a growth rate of 0.2 microns per hour in the case where the InP layer deposition is carried out instead of the first layer deposition under conditions in which the ratio of the flow rate of the source material of P to the total flow rate of the carrier gas and the temperature of the substrate are the same as those during the first layer deposition but the growth rate of the InP layer is different from that of the first layer.

The preferable condition for the first layer's growth can be found out easily by obtaining the above conditions based on measured photoluminescence intensity of an InGaAsP layer which corresponds to the active layer.

According to the other aspect of the present invention, it is provided a manufacture method of a semiconductor device comprising the steps of: depositing a diffraction grating layer, which is made of a III–V compound semiconductor having a refractive index which is different from a refractive index of InP, on a surface of a substrate; forming a plurality of grooves in said diffraction grating layer so as to reach the substrate surface in order to form a diffraction grating; depositing a first layer of InP so as to fill said grooves and cover said diffraction grating layer, by metal organic chemical vapor deposition in which an organic metal is used as a source material of In, one of $PH_3$ and organophosphorus is used as a source material of P, $H_2$ is used as a carrier gas, and the temperature of the substrate is set at 400–500° C., while satisfying an inequality of $\log_{10} FR \geq 4.4 DR - 1.3$ where DR represents the growth rate by microns per hour, and FR % is the ratio of a flow rate of the source material of P to a total flow rate of the carrier gas; and depositing a second layer of InP on said first layer with the substrate temperature being higher than that during the first layer deposition.

After the deposition of the first layer under the above conditions, a III–V compound semiconductor layer having excellent crystallinity can be deposited on the second layer.

According to the other aspect of the present invention, it is provided a manufacture method of a semiconductor device comprising the steps of: depositing a diffraction grating layer, which is made of a III–V compound semiconductor having a refractive index which differs from a refractive index of InP, on a substrate having a surface layer of InP; forming grooves in said diffraction grating layer so as to reach the substrate surface, in order to form a diffraction grating; depositing a first layer of InP so as to fill said grooves and cover said diffraction grating layer, by metal organic chemical vapor deposition in which an organic metal is used as a source material of In, $H_2$ is used as a carrier gas, and the temperature of the substrate is set at 400–500° C.; and depositing a second layer of InP on said first layer with the substrate temperature being set higher than that during the first layer deposition; wherein said method further comprises the step of heating said substrate having said grooves up to a temperature for growing said first layer, in $H_2$ atmosphere including the source material of P used in the first layer deposition, before the step of depositing said first layer.

Because the atmosphere during the heating process is the $H_2$ atmosphere including the source material to be P, P is prevented from being removed from the surface of the InP layer.

As explained above, an InP layer is deposited on a diffraction grating of a III–V compound semiconductor under relatively low temperature to cover the diffraction grating. According to this structure, the diffraction grating is prevented from being transformed by heat. After covering the diffraction grating by the InP layer, another InP layer is deposited under relatively high temperature. Thus deposited InP layer shows excellent crystallinity. Because the conditions for the InP layer's growth under low temperature are optimized, an active layer, a waveguide, and the like having excellent crystallinity can be deposited on the InP layer.

DETAILED DESCRIPTION OF THE PREFERRED EMBODIMENT

First Embodiment

A manufacture method of a semiconductor device according to the first embodiment will now be described with reference to FIGS. 1A to 1D.

Figure 1A:
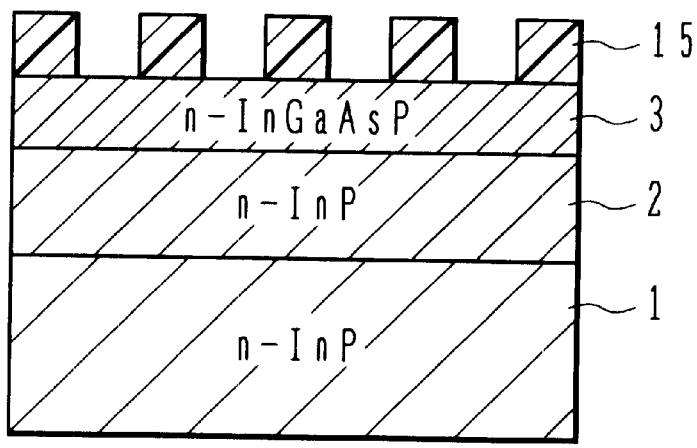
FIGS. 1A to 1D are cross-sectional views showing a substrate, for explaining the manufacture method of a semiconductor device according to the first embodiment of the present invention.

As shown in FIG. 1A, a buffer layer 2 of n-type InP having the thickness of 0.3 microns is deposited on a principal surface of an n-type InP substrate 1. A diffraction grating layer 3 of n-type InGaAsP having the thickness of 100 nm is deposited on the buffer layer 2. The diffraction grating layer 3 has band gap which corresponds to the wavelength of 1.1 microns. The n-type InP buffer layer 2 and the n-type InGaAsP diffraction grating layer 3 are formed by the low pressure Metal Organic Chemical Vapor Deposition (low pressure MOCVD). The conditions of the deposition are as follows: the substrate is heated up to 630° C. while applying the pressure of 50 Torr.

Trimethylindium (TMIn) is used as a source material for In. Triethylgallium (TEGa) is for Ga. Arsine ($AsH_3$) is for As. Phosphine ($PH_3$) is for P. $H_2$ is used for a carrier gas. Sn of $2 \times 10^{18}$ cm$^{-3}$ is doped in the n-type InP substrate 1 as n-type dopant. Si of $5 \times 10^{17}$ cm$^{-3}$ is doped in the n-type InP buffer layer 2 and the n-type InGaAsP diffraction grating layer 3 as n-type dopant. Disilane ($Si_2H_6$) is, for example, used as a source material for Si.

A grating-patterned resist (resist pattern) 15 is formed on the surface of the diffraction grating layer 3 by, for example, interference exposure.

Figure 1B:
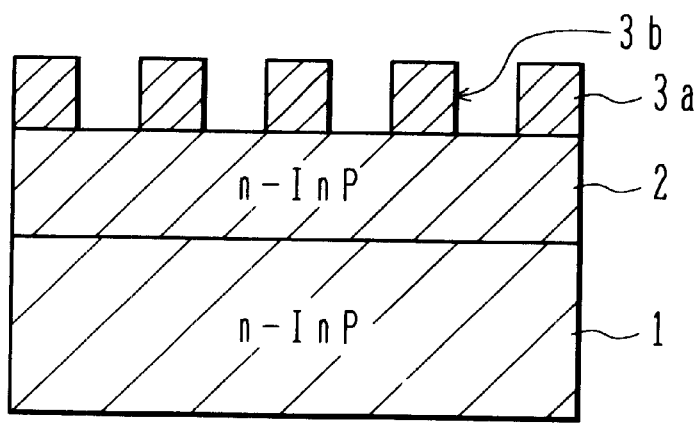

As shown in FIG. 1B, the diffraction grating layer 3 is partially etched off with the resist pattern 15 as a mask to form a plurality of grooves 3b which reach the surface of the buffer layer 2. This etching is performed by, for example, the wet etching with etchant which is a mixture of $H_2SO_4$, $H_2O_2$ and $H_2O$. By the wet etching, InGaAsP can be selectively removed when the mixture ratio of the etchant is optimized, however, InP is not removed. Therefore, the buffer layer 2 of InP works as a etching stopper layer during the etching process. It is difficult to selectively remove InGaAsP by dry etching. In the case of the dry etching, the over etching is performed so that the upper portion of the buffer layer 2 is etched a little. After the grooves 3b is formed, the resist pattern 15 is removed.

Thus, a diffraction grating 3a is formed on the buffer layer 2. The wavelength of a laser beam to be oscillated in the active layer determines the pitch of the diffraction grating 3a. For example, to obtain a laser beam whose wavelength is 1.3 microns, determined pitch of the diffraction grating 3a is 0.2 microns.

Figure 1C:
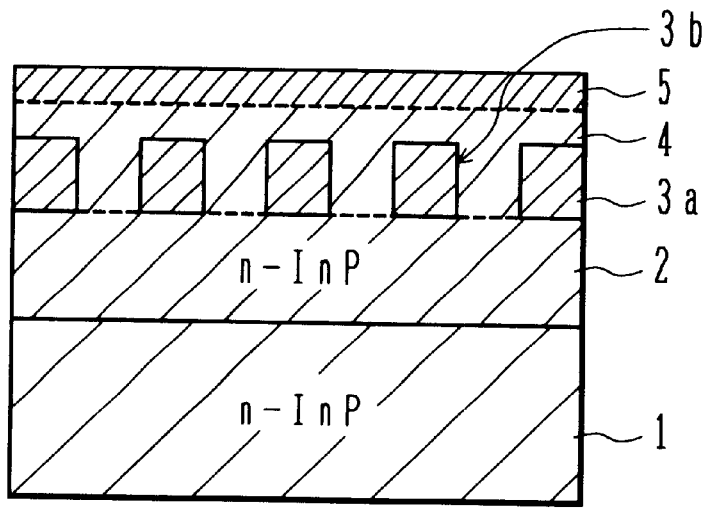

As shown in FIG. 1C, a first layer 4 of n-type InP whose silicon concentration is $5 \times 10^{17}$ cm$^{-3}$ is formed on the diffraction grating layer 3 so as to fill the grooves 3b and cover the diffraction grating 3a so that the thickness above the diffraction grating 3a is 50 nm. The first layer 4 is deposited by the MOCVD. TMIn is used as a source material of In, and $PH_3$ is used as a source material for P. $H_2$ gas is used as a carrier gas. $Si_2H_6$ is used as a source for dopant. The substrate temperature is 470° C. The total flow rate of $H_2$ gas is 6000 sccm.

The substrate is heated up to 470° C. under $H_2$ atmosphere which includes $PH_3$. $PH_3$ included in the $H_2$ atmosphere helps to prevent P from being removed from the n-type InP buffer layer 2 through the grooves 3b. If there is other material of Group V element except P during the heat up process, the surface of the n-type InP buffer layer 2 reacts with such material. This reaction makes the surface of the buffer layer 2 rough. To avoid this phenomenon, it is preferable that the supplied Group V element is limited to only P.

After the deposition of the first layer 4, the substrate is heated up to 630° C. for about 5 minutes to deposit a second layer 5 on the first layer 4. The second layer 5 is composed of n-type InP with silicon concentration of $5\times10^{17}$ cm$^{-3}$ and its thickness is 50 nm. During this heat up process, the diffraction grating 3a is covered with the first layer 4, therefore, the diffraction grating 3a is prevented from being transformed by heat. Moreover, the thickness (amplitude of the corrugation) and the pitch of the diffraction grating 3a is controlled accurately. Because the substrate temperature during the deposition of the second layer 5 is higher than that during the deposition of the first layer 4, the top surface of the substrate can keep its crystallinity being excellent during the deposition.

The substrate may be heated up while depositing the second layer 5 after the deposition of the first layer 4. In this case, for example, deposition of an n-type InP layer having the thickness of 30 nm is carried out during the heat up process, and then, deposition of an n-type InP layer having thickness of 20 nm is carried out while keeping the substrate temperature at 630° C. By this process, continuity of boundary between the first layer 4 and the second layer 5 is improved. Or, the substrate may be heated after the growth of crystal is stopped once, and the deposition of the second layer 5 may be performed after the substrate temperature reaches a predetermined temperature. In this case, the amount of the dopant into the second layer 5 is controlled easily. The substrate temperature during a growth period of the second layer 5 may be in the range of 600–700° C.

In the case where deposition of mixed crystal containing three or more kinds of elements is carried out, uneven composition, i.e., composition modulation often appears. In the above described cases, however, such uneven composition does not appear because InP including two elements is deposited on the diffraction grating 3a.

Figure 1D:
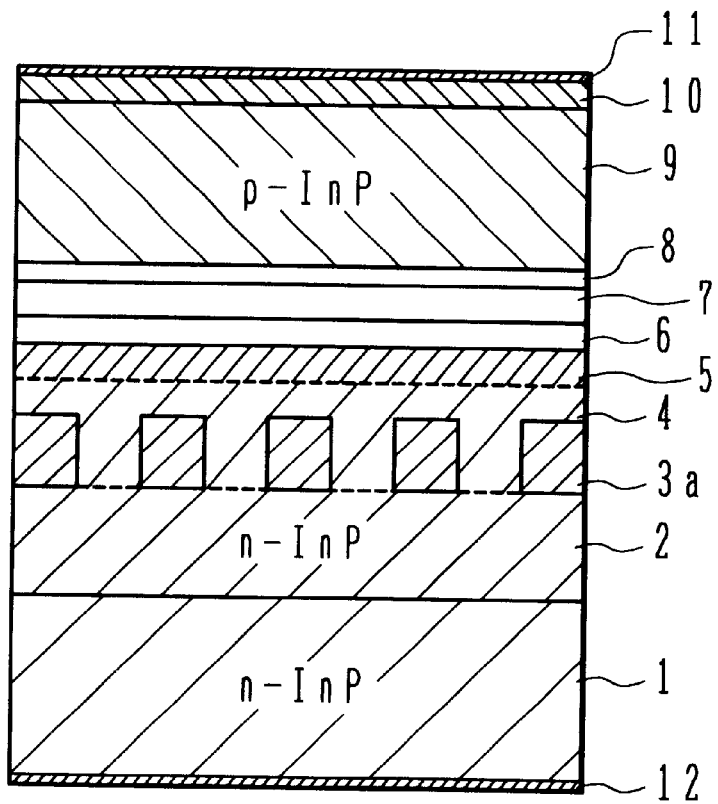

As shown in FIG. 1D, a lower guide layer 6, an active layer 7, an upper guide layer 8, an upper cladding layer 9 and a contact layer 10 are deposited on the second layer 5 in this order.

Each of the lower guide layer 6 and the upper guide layer 8 is a layer of InGaAsP including no dopant, which has thickness of 50 nm, and its band gap corresponds to the wavelength of 1.1 microns.

The active layer 7 has the multi quantum well structure which includes eleven barrier layers and ten well layers stacked one after the other. Each of the barrier layers is an InGaAsP layer having the thickness of 10 nm and its band gap corresponds to the wavelength of 1.1 microns. Each of the well layers is an InGaAsP layer having the thickness of 5 nm and its band gap corresponds to the wavelength of 1.3 microns. The active layer 7 may be composed of InGaAs or AlInGaAs.

The upper cladding layer 9 is a p-type InP layer whose Zn concentration is $5\times10^{17}$ cm$^{-3}$ having thickness of 0.5 microns. The contact layer 10 is a p-type InGaAsP layer whose Zn concentration is $1\times10^{18}$ cm$^{-3}$ having thickness of 50 nm and its band gap corresponds to the wavelength of 1.2 microns.

A p-electrode 11 is formed on the surface of the contact layer 10. An n-electrode 12 is formed on the bottom surface of the InP substrate 1. The p-electrode 11 is structured by, for example, layering Au, Pt and Ti. The n-electrode 12 is structured by, for example, layering Au, Ge and Ni.

Coupling coefficient resulted by the DFB laser device shown in FIG. 1D is 150 cm$^{-1}$. The resultant coefficient is almost equal to the designed coefficient.

Figure 2:
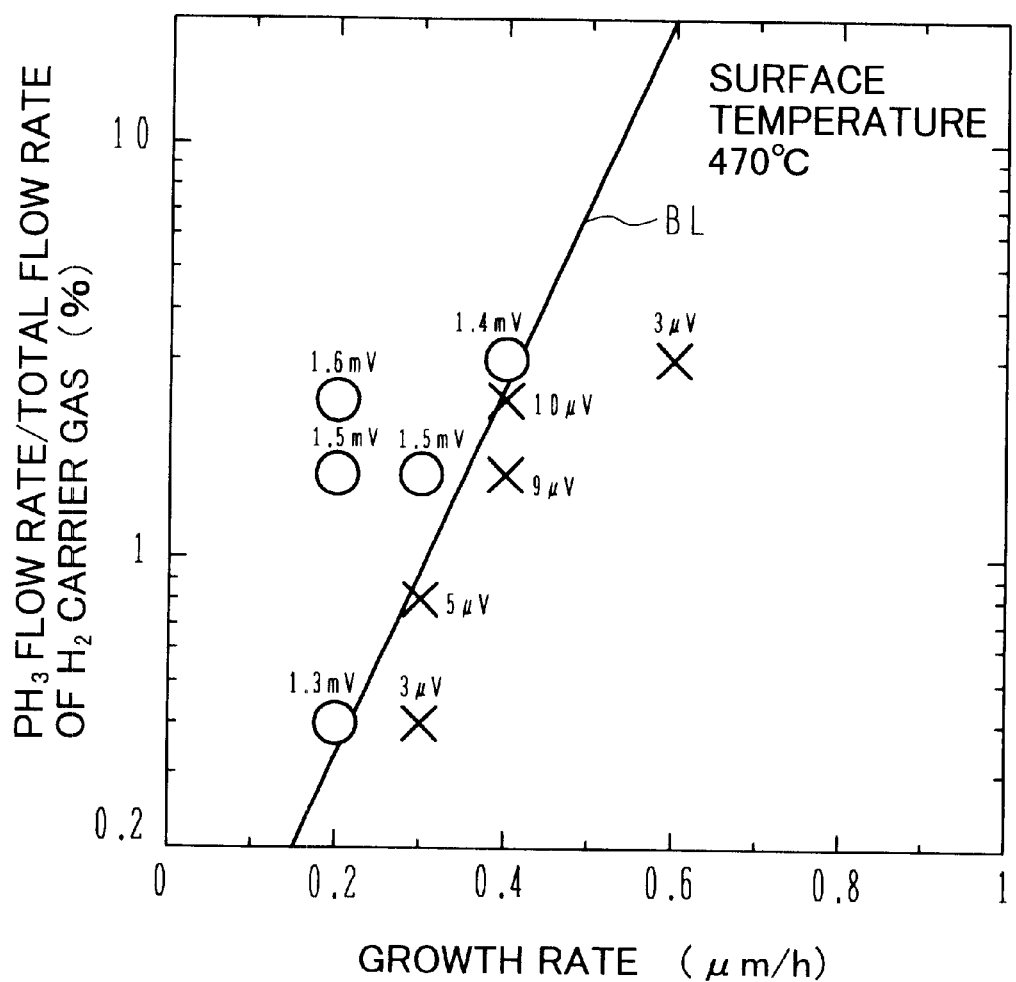
FIG. 2 is a graph showing photoluminescence intensity of an active layer on an InP layer in accordance with changes of growth rate of the InP layer filling a diffraction grating and the ratio of the flow rate of $PH_3$ relative to a total flow rate of carrier gas.

FIG. 2 shows photoluminescence intensity of the active layer 7 in the laser structure shown in FIG. 1D where the growth rate during the deposition of the first layer 4 and the ratio of the flow rate of PH$_3$ to the total flow rate of the carrier gas are changed. The wavelength of an induced light used for measuring the photoluminescence is 0.647 microns. The horizontal axis indicates the growth rate of the first layer 4 by microns per hour, and the vertical axis indicates the ratio of the flow rate of PH$_3$ to the total flow rate of the carrier gas by %. Circles in the graph represent relatively large photoluminescence intensities, and crossings in the graph represent small photoluminescence intensities. Values beside those symbols denote voltages detected by a photoluminescence measuring instrument. The voltages are almost in proportion to the photoluminescence intensities.

Reference character "BL" denotes a boundary line which divides an area into two. As shown in FIG. 2, relatively large photoluminescence intensities appear in a left side area. The photoluminescence intensities in the left side area are hundred times as large as those in a right side area. That is, there are great differences over the boundary line BL. The laser structure has a specular surface when the deposition of the first layer 4 is carried out under conditions in the left side area. However, the surface is rough when the first layer 4 is deposited under conditions in the right side area. That is, a high quality active layer can be formed by depositing the first layer 4 shown in FIG. 1C under the conditions in the left side area shown in FIG. 2.

The boundary line BL is determined by the equation of $\log_{10}FR=4.4DR-1.3$ where DR denotes the growth rate (microns/h) and FR denotes the ratio of the flow rate of PH$_3$ relative to the total flow rate of the carrier gas. Therefore, it is preferable that the deposition of the first layer 4 is carried out under the condition which satisfies the inequality of $\log_{10}FR \geq 4.4DR-1.3$.

FIG. 2 shows a result where the substrate temperature while the first layer 4 is growing is 470° C. Even if the first layer 4 is deposited under the substrate temperature is in the range of 400–500° C., almost the same result may be obtained.

Figure 3A:
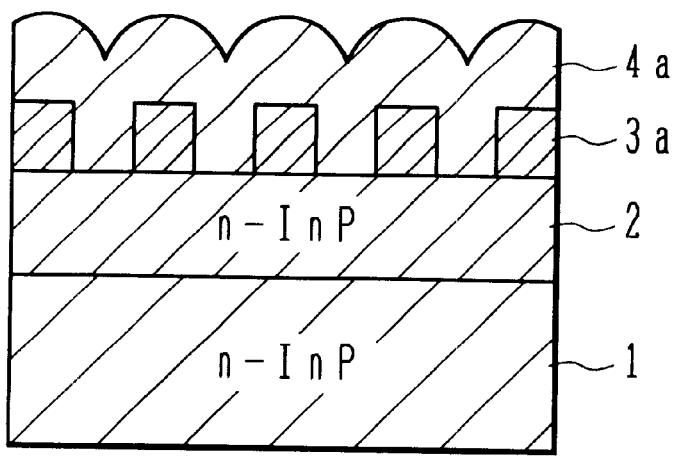
FIGS. 3A to 3C are cross-sectional views showing the substrate when the temperatures while the InP layer is growing, filling the diffraction grating, are respectively 380° C., 450° C. and 520° C.
Figure 3B:
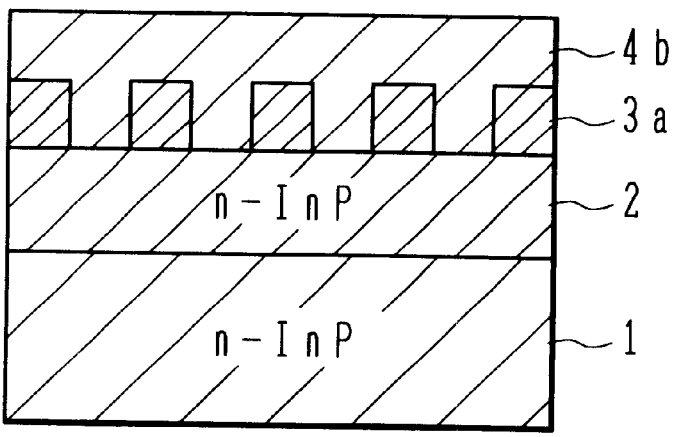
Figure 3C:
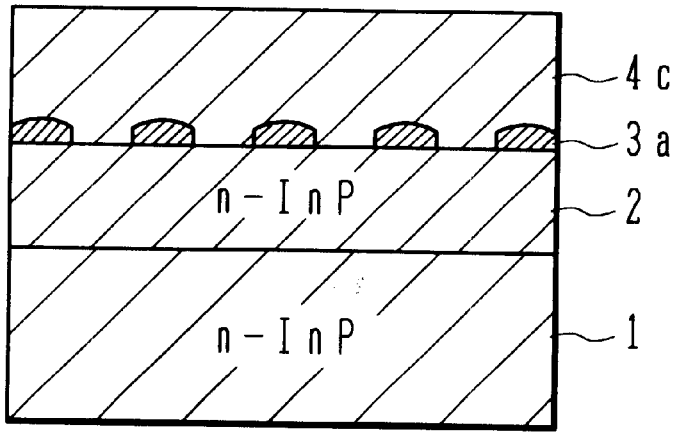

FIGS. 3A to 3C are cross-sectional views showing substrates after first layers 4a to 4c are deposited under different substrate temperatures of 380° C., 450° C. and 520° C. respectively. In the case where the substrate temperature is 380° C. as shown in FIG. 3A, the first layer 4a has a corrugated surface corresponding to the corrugation of the diffraction grating 3a. When the substrate temperature is low, mass transport from convex portions to recess portions of the corrugated diffraction grating 3a hardly occurs during the deposition of the first layer 4a. This may cause the surface of the first layer 4a to be corrugated. In the case where the substrate temperature is 520° C. as shown in FIG. 3C, the diffraction grating 3a is thinned while the first layer 4c is growing, and resultant sections of the ridged diffraction grating 3a are round-shaped. When the substrate temperature is high, the diffraction grating 3a is transformed or deformed by heat. This may cause the above described phenomenon.

When the substrate temperature is 450° C. as shown in FIG. 3B, the diffraction grating 3a is prevented from being transformed or deformed by heat, and flattened first layer 4b is formed. Accordingly, preferable substrate temperature during the deposition of the first layer 4 is in the range of 400–500° C.

According to FIG. 2, the preferable condition for forming an excellent active layer is that the ratio FR of the flow rate of PH$_3$ relative to the flow rate of H$_2$ is equal to or greater than 0.4% when the growth rate is 0.2 microns per hour. In FIG. 2, as the growth rate of the first layer 4 is accelerated gradually from 0.2 microns/h while the flow rate ratio FR is fixed, a resultant point moves laterally rightward. After the point reaches the boundary line BL, the photoluminescence intensity decreases rapidly. The decreased photoluminescence intensity is at least one tenth as small as that when the growth rate is 0.2 microns/h. Preferable growth rate of the first layer deposition is lower than the rate at which the photoluminescence intensity is one tenth as small as that when the growth rate is 0.2 microns/h. When the growth rate is thus optimized, an excellent active layer is formed.

It is preferable that the flow rate ratio FR is set to equal to or less than 20% because a toxicant remover having higher ability is required when the flow rate of $PH_3$ increases. In the case where the flow rate ratio FR is set to 20%, the growth rate of the first layer 4 is allowed to be accelerated up to 0.6 microns per hour.

During the process shown in FIG. 1C, it is preferable that the growth rate of the second layer 5 is set higher than that of the first layer 4. In the case where the second layer 5 grows while the substrate is heated gradually at early in the growth period, the growth rate is accelerated gradually, for example, from 0.2 to 1.0 microns per hour, as the substrate temperature increases. Generally, the crystallinity of the grown layer is deteriorated under high substrate temperature and extremely low growth rate. Acceleration of the second layer's growth rate prevents the crystallinity from being deteriorated.

Moreover, it is preferable that the element ratio of Group V to Group III (V/III ratio) during the growing period of the first layer 4 is set larger than that during the growing period of the second layer 5. For example, the V/III ratio is set to 1500 when the substrate temperature is 450° C. during the growing period, and is set to 100 when the substrate temperature is 630° C. during the growing period. The thermal decomposition efficiency of the Group V element decreases when the first layer 4 is grown under low temperature. To prevent the crystallinity of the first layer 4 from being deteriorated when the substrate temperature during the growing period is low, increase the amount of the Group V element to be supplied.

In the above embodiment, Si is used as the n-type dopant with $Si_2H_6$ as the source material. Se, S, or the like may be used as the n-type dopant. For example, $H_2Se$ is used as the source for Se, $H_2S$ is used as the source for S. It is relatively easy to control the impurity concentration in the range of $1 \times 10^{17}$ $cm^{-3}$ or more with the above dopants.

The diffraction grating 3a is made of InGaAsP in the above embodiment, however, the diffraction grating 3a may be made of other III–V compound semiconductor whose refractive index is different from that of InP. For example, the diffraction grating 3a may be made of InGaAs, InAlAs or InGaAlAs.

In the case where a layer including Al as the Group III element is deposited, for example, trimethylaluminum (TMAl) is used as the source material and the substrate temperature is set to approximately 680° C.

In the process shown in FIG. 1A according to the first embodiment, a protection layer of InP may be deposited on the n-type InGaAsP diffraction grating layer 3. The protection layer protects the diffraction grating layer 3 from being deteriorated until the formation of the resist pattern 15. The protection layer is removed just before a resist layer for the resist pattern 15 is formed.

In the first embodiment, $PH_3$ is used as the source material of P. Even if organophosphorus compound such as di-tertiary-butyl phosphine (DTBP) is used as the source material, the same phenomenon occurs.

Second Embodiment

The second embodiment will now be described with reference to FIGS. 4A to 4C.

Figure 4A:
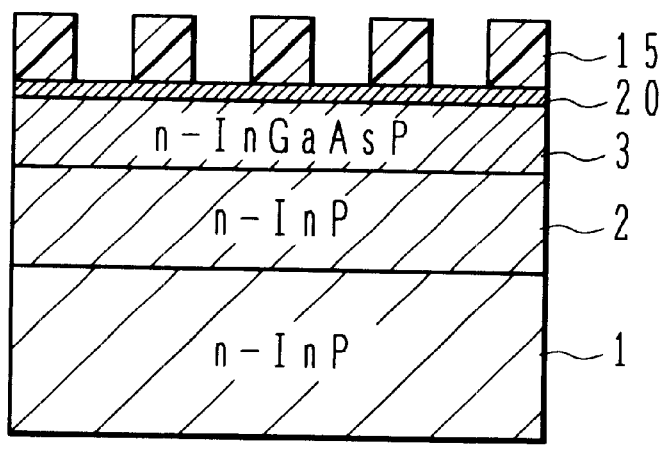
FIGS. 4A to 4C are cross-sectional views showing a substrate, for explaining a manufacture method of a semiconductor device according to the second embodiment of the present invention.

As shown in FIG. 4A, the n-type InP buffer layer 2 and the n-type InGaAsP diffraction grating layer 3 are deposited on the InP substrate 1 in the same manner described in the first embodiment. In the first embodiment, the resist pattern 15 is formed directly on the n-type InGaAsP diffraction grating layer 3. In this embodiment, a cap layer 20 of n-type InP having the thickness of 20 nm is deposited on a diffraction grating layer 3 having the thickness of 80 nm, and then the resist pattern 15 is formed thereon.

The cap layer 20 and the diffraction grating layer 3 are partially etched using the resist pattern 15 as a mask by dry etching with etchant gas, for example, mixture of $C_2H_6$ and $H_2$. The n-type InP buffer layer 2 may be etched partially. After the etching, the resist pattern 15 is removed.

Figure 4B:
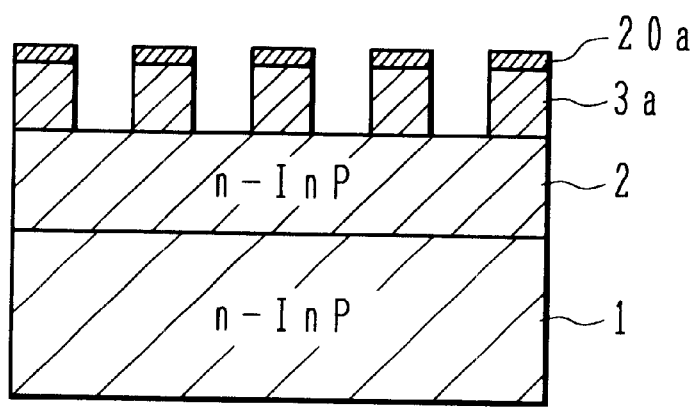

FIG. 4B is a cross-sectional view showing the substrate after the resist pattern 15 is removed. The n-type InP cap layer 20a remains on ridges of the diffraction grating 3a.

Figure 4C:
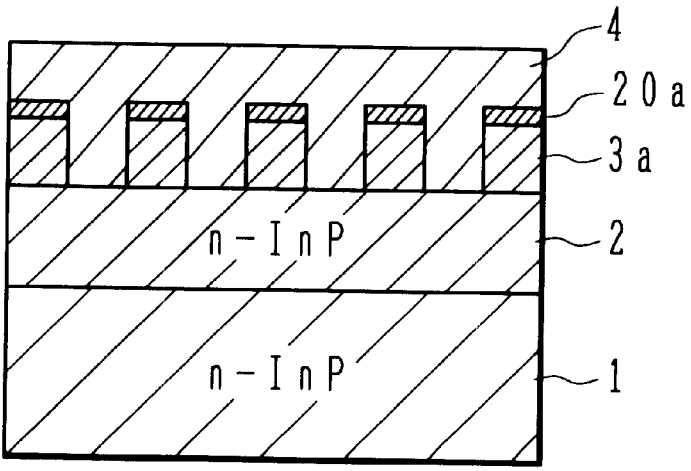

A first layer 4 is deposited on the substrate, as shown in FIG. 4C, so as to cover the diffraction grating 3a and the n-type InP cap layer 20a on the ridges of the diffraction grating 3a. The deposition is carried out in the same manner described in the first embodiment referring to FIG. 1C. The following steps after the step show in FIG. 4C are the same as those described in the first embodiment referring to FIGS. 1C and 1D.

The n-type InP cap layer 20a formed on the n-type InGaAsP diffraction grating 3a is effective for preventing the InGaAsP diffraction grating 3a from being transformed by heat. Ordinarily, the first layer 4 starts to grow when the substrate temperature reaches a suitable temperature for growing the first layer 4. To evaluate the effect of the n-type InP cap layer 20a, a 30-minute interval is provided between a point when the substrate temperature reaches the first layer's growth temperature of 470° C. and a point to start the growing. In this case, the thermal transformation of the diffraction grating 3a seldom occurs after the deposition of the first layer 4.

In the case where no n-type lnP cap layer 20a is formed on the diffraction grating 3a, the height of the ridged diffraction grating 3a is reduced about 10% after the deposition of the first layer 4. Moreover, the reduced ridges of the diffraction grating 3a shows round-shaped sections. Accordingly, to keep preferred shape of the diffraction grating 3a without the cap layer 20a, the first layer 4 must be deposited on the diffraction grating 3a immediately after the substrate temperature reaches 470° C.

According to the second embodiment, the preparation of the n-type InP cap layer 20a helps to make a larger margin at beginning of the first layer's growing period. Moreover, the diffraction grating 3a can be formed with excellent reproductiveness.

Third Embodiment

The third embodiment will now be described with reference to FIGS. 5A and 5B. In the first and second embodiments, a single InGaAsP diffraction grating 3a is formed. A diffraction grating in the third embodiment has the multi-layer structure.

Figure 5A:
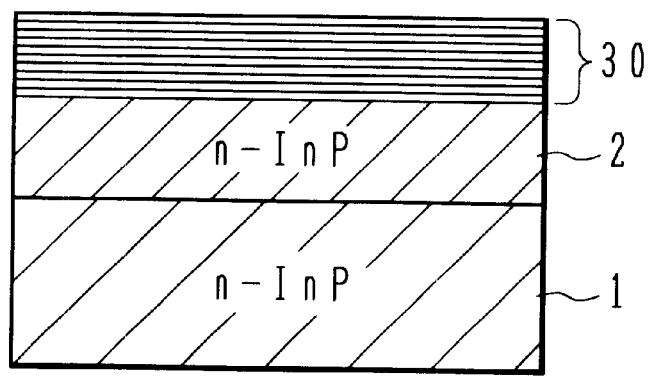
FIGS. 5A and 5B are cross-sectional views showing a substrate, for explaining a manufacture method of a semiconductor device according to the third embodiment of the present invention.
Figure 5B:
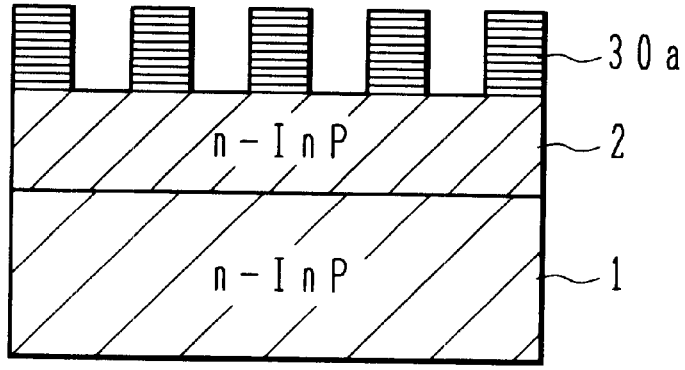
Figure 6:
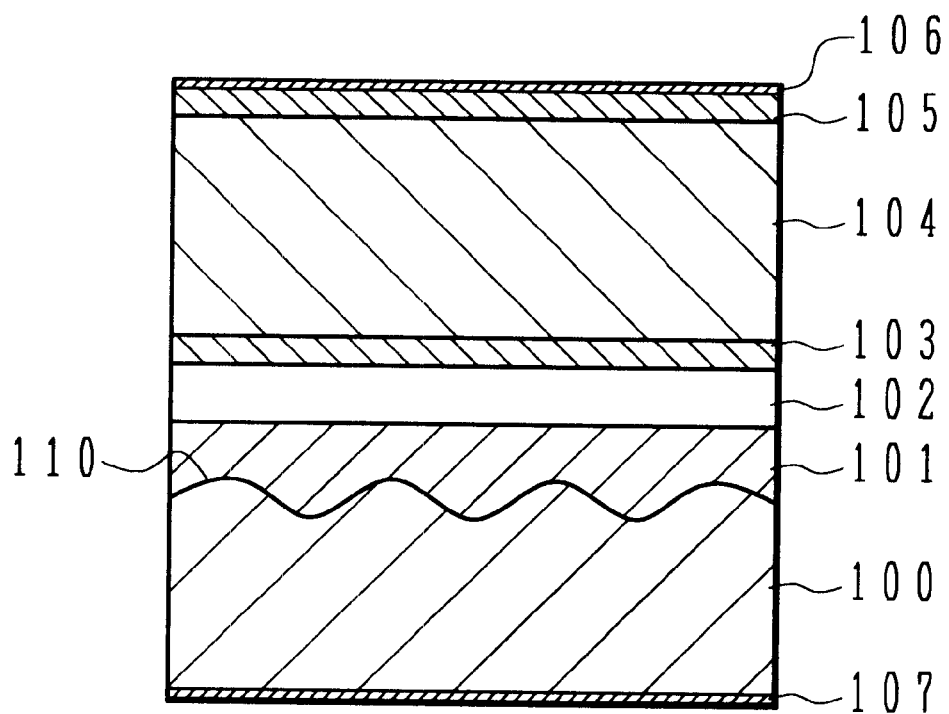
FIG. 6 is a cross-sectional view showing a conventional DFB laser device.

As shown in FIG. 5A, a multi-layered diffraction grating layer 30 is deposited on an n-type InP buffer layer 2. The diffraction grating layer 30 has the multi-layer structure of two kinds of thin layers. A unit of the layers includes n-type InGaAs layer having the thickness of 10 nm and n-type InP layer having the thickness of 10 nm, and five units are layered in the diffraction grating 30. The impurity concentration of those thin layers are the same as that of the diffraction grating layer 3 shown in FIG. 1A.

As shown in FIG. 5A, the multi-layered diffraction grating layer 30 is patterned to form diffraction grating 30a. Dry etching is carried out for patterning the diffraction grating layer 30. In this case, mixture gas of, for example, $C_2H_6$ and $H_2$ is used as an etchant gas. The following steps after the step shown in FIG. 5B are the same as the steps described in the first embodiment with reference to FIG. 1B.

Including layers which are hardly transformed by heat in the multi-layer structure prevents the diffraction grating 30a from being transformed by heat. Although the diffraction grating 30a shown in FIGS. 5A and 5B includes layers of InGaAs and InP, the other materials may be used to form the multi-layer structure. At least one layer of a plurality of thin layers of the diffraction grating has refractive index which is different from that of InP.

In the above embodiments, the cases where the present invention is applied to the DFB laser device, however, the present invention is not limited to that. Semiconductor device with diffraction grating such as a distributed Bragg reflector (DBR) laser device, or a grating filter may employ the present invention.

The present invention is not limited to the embodiments above, but may be modified as needed.

What is claimed is:

1. A manufacturing method of a semiconductor device, comprising the steps of:

depositing a III–V compound semiconductor layer, having a refractive index which differs from a refractive index of InP, on a surface of a substrate;

forming a plurality of grooves in said compound semiconductor layer so as to reach said substrate surface, in order to form a diffraction grating;

forming a first layer of InP so as to directly fill said grooves and cover said diffraction grating, by metal organic chemical vapor deposition (MOCVD) in which an organic metal is used as a source material of In, one of $PH_3$ and organophosphorus is used as a source material of P, and $H_2$ is used as a carrier gas;

forming a second layer of InP on said first layer with the temperature of the substrate being higher than that during the first layer formation; and forming an active layer on said second layer;

wherein said first layer is deposited at a growth rate lower than such a growth rate of an InP layer as to cause a photoluminescence intensity of a layer corresponding to said active layer to be one tenth as small as that when the InP layer is deposited at a growth rate of 0.2 microns per hour in the case where the InP layer deposition is carried out instead of the first layer deposition under conditions in which the ratio of the flow rate of the source material of P to the total flow rate of the carrier gas and the temperature of the substrate are the same as those during the first layer deposition but the growth rate of the InP layer is different from that of the first layer.

2. The manufacturing method according to claim 1, wherein said active layer has a multi quantum well structure which includes well layers of InGaAsP.

3. A manufacturing method of a semiconductor device, comprising the steps of:

depositing a diffraction grating layer, which is made of a III–V compound semiconductor having a refractive index which is different from a refractive index of InP, on a surface of a substrate;

forming a plurality of grooves in said diffraction grating layer so as to reach the substrate surface in order to form a diffraction grating;

depositing a first layer of InP so as to fill said grooves and cover said diffraction grating layer, by the metal organic chemical vapor deposition (MOCVD) in which an organic metal is used as a source material of In, one of $PH_3$ and organophosphorus is used as a source material of P, $H_2$ is used as a carrier gas, and the temperature of the substrate is set at 400–500° C., while satisfying an inequality of $\log_{10} FR \geq 4.4 DR - 1.3$ where DR represents the growth rate by microns per hour, and FR % is the ratio of a flow rate of the source material of P to a total flow rate of the carrier gas; and depositing a second layer of InP on said first layer with the substrate temperature being higher than that during the first layer deposition.

4. A manufacturing method of a semiconductor device, comprising the steps of:

depositing a diffraction grating layer, which is made of a III–V compound semiconductor having a refractive index which differs from a refractive index of InP, on a substrate having a surface layer of InP;

forming grooves in said diffraction grating layer so as to reach the substrate surface, in order to form a diffraction grating;

depositing a first layer of InP so as to fill said grooves and cover said diffraction grating layer, by metal organic chemical vapor deposition in which an organic metal is used as a source material of In, $H_2$ is used as a carrier gas, and the temperature of the substrate is set at 400–500° C.; and depositing a second layer of InP on said first layer with the substrate temperature being set higher than that during the first layer deposition;

wherein said method further comprises the step of heating said substrate having said grooves up to a temperature for growing said first layer, in $H_2$ atmosphere including the source material of P used in the first layer deposition, before the step of depositing said first layer.

5. The manufacturing method according to claim 1, further comprising the step of depositing a third layer of InP on said compound semiconductor layer after the step of depositing said III–V compound semiconductor layer, wherein said grooves are formed so as to extend up to at least a lower surface of said III–V compound semiconductor layer from an upper surface of said third layer, during the step of forming said grooves.

6. The manufacturing method according to claim 3, further comprising the step of depositing a third layer of InP on said diffraction grating layer after the step of depositing said diffraction grating layer, wherein said grooves are formed so as to extend up to at least a lower surface of said diffraction grating layer from an upper surface of said third layer, during the step of forming said grooves.

7. The manufacturing method according to claim 4, further comprising the step of depositing a third layer of InP on said diffraction grating layer after the step of depositing said diffraction grating layer, wherein said grooves are formed so as to extend up to at least a lower surface of said diffraction grating layer from an upper surface of said third layer, during the step of forming said grooves.

8. The manufacturing method according to claim 1, further comprising the steps of:

covering said III–V semiconductor layer with a protection layer of InP;

exposing said substrate which is covered with said protection layer to the atmosphere; and removing said protection layer, wherein the step of covering said III–V compound semiconductor layer, the step of exposing said substrate and the step of removing said protection layer are carried out after the step of depositing said III–V compound semiconductor layer and before the step of forming said grooves.

9. The manufacturing method according to claim 3, further comprising the steps of:

covering said diffraction grating layer with a protection layer of InP;

exposing said substrate which is covered with said protection layer to the atmosphere; and removing said protection layer, wherein the step of covering said diffraction grating layer, the step of exposing said substrate and the step of removing said protection layer are carried out after the step of depositing said diffraction grating layer and before the step of forming said grooves.

10. The manufacturing method according to claim 4, further comprising the steps of:

covering said diffraction grating layer with a protection layer of InP;

exposing said substrate which is covered with said protection layer to the atmosphere; and removing said protection layer, wherein the step of covering said diffraction grating layer, the step of exposing said substrate and the step of removing said protection layer are carried out after the step of depositing said diffraction grating layer and before the step of forming said grooves.

11. The manufacturing method according to claim 1, wherein the step of depositing said III–V compound semiconductor layer includes the step of laminating a plurality of thin layers, and at least one of said plurality of thin layers has a refractive index which is different from that of InP.

12. The manufacturing method according to claim 3, wherein the step of depositing said diffraction grating layer includes the step of laminating a plurality of thin layers, and at least one of said plurality of thin layers has a refractive index which is different from that of InP.

13. The manufacturing method according to claim 4, wherein the step of depositing said diffraction grating layer includes the step of laminating a plurality of thin layers, and at least one of said plurality of thin layers has a refractive index which is different from that of InP.

14. The manufacturing method according to claim 1, wherein the second layer deposition is carried out at the substrate temperature of 600–700° C. during the step of depositing said second layer.

15. The manufacturing method according to claim 3, wherein the second layer deposition is carried out at the substrate temperature of 600–700° C. during the step of depositing said second layer.

16. The manufacturing method according to claim 4, wherein the second layer deposition is carried out at the substrate temperature of 600–700° C. during the step of depositing said second layer.

17. The manufacturing method of the semiconductor device according to claim 1, wherein said second layer is deposited at a growth rate higher than that in the first layer deposition, during the step of depositing said second layer.

18. The manufacturing method of the asemiconductor device according to claim 3, wherein said second layer is deposit ed at a growth rate higher than that in the first layer deposition, during the step of depositing said second layer.

19. The manufacturing method according to claim 1, wherein the ratio of Group V element to Group III element during the step of depositing said first layer is set higher than that during the second layer deposition.

20. The manufacturing method according to claim 3, wherein the ratio of Group V element to Group III element during the step of depositing said first layer is set higher than that during the second layer deposition.

* * * * *